(12) United States Patent
Kikegawa et al.

(10) Patent No.: US 8,367,191 B2
(45) Date of Patent: Feb. 5, 2013

(54) OPTICAL THIN-FILMS AND OPTICAL ELEMENTS COMPRISING SAME

(75) Inventors: Shinya Kikegawa, Saitama (JP); Toshimasa Nishi, Saitama (JP); Motoo Takada, Saitama (JP)

(73) Assignee: Nihon Dempa Kogyo Co., Ltd., Tokyo (JP)

(*) Notice: Subject to any disclaimer, the term of this patent is extended or adjusted under 35 U.S.C. 154(b) by 0 days.

(21) Appl. No.: 13/293,057

(22) Filed: Nov. 9, 2011

(65) Prior Publication Data

US 2012/0064315 A1    Mar. 15, 2012

Related U.S. Application Data

(62) Division of application No. 12/133,287, filed on Jun. 4, 2008, now Pat. No. 8,075,947.

(30) Foreign Application Priority Data

Jun. 5, 2007 (JP) .................................. 2007-148760

(51) Int. Cl.
  *B32B 3/02* (2006.01)
(52) U.S. Cl. ........ 428/212; 428/426; 428/601; 428/156; 428/688; 351/41; 351/159.64
(58) Field of Classification Search ............ 428/426, 428/212, 141, 156, 195.1, 600, 601, 688; 351/41, 159.64
See application file for complete search history.

(56) References Cited

U.S. PATENT DOCUMENTS

| | | | |
|---|---|---|---|
| 5,308,461 A | 5/1994 | Ahonen | |
| 5,872,655 A | 2/1999 | Seddon et al. | |
| 6,852,473 B2 * | 2/2005 | Roberts et al. | 430/315 |
| 7,311,938 B2 | 12/2007 | Koenig et al. | |
| 7,656,618 B2 | 2/2010 | Suzuki | |
| 2001/0051499 A1 | 12/2001 | Shinozaki | |
| 2002/0012746 A1 | 1/2002 | Mearini et al. | |
| 2002/0185369 A1 | 12/2002 | Sawamura | |
| 2003/0180030 A1 | 9/2003 | Hirose et al. | |
| 2004/0195965 A1 | 10/2004 | Yamazaki et al. | |
| 2005/0016834 A1 | 1/2005 | Sawamura | |
| 2005/0099611 A1 | 5/2005 | Sogard | |
| 2005/0109616 A1 | 5/2005 | Ohta et al. | |
| 2005/0145939 A1 * | 7/2005 | Okada et al. | 257/347 |
| 2007/0245955 A1 | 10/2007 | Stohl et al. | |

FOREIGN PATENT DOCUMENTS

JP    02-176601    *    7/1990

(Continued)

OTHER PUBLICATIONS

Aikayama JP 2003-183821 English machine translation Jul. 3, 2003.*

(Continued)

*Primary Examiner* — Jennifer McNeil
*Assistant Examiner* — Lauren Colgan
(74) *Attorney, Agent, or Firm* — Klarquist Sparkman, LLP

(57) ABSTRACT

Optical thin-films are disclosed that are formed from optical thin films formed on a base plate arranged in a vacuum chamber. The base plates are held on a plurality of retaining frames of a base-plate retainer. The thin films are formed by heating the base plate and emitting a deposition material from a deposition source. The retaining frames are configured to make the entire base plate uniformly heated.

5 Claims, 11 Drawing Sheets

FOREIGN PATENT DOCUMENTS

| | | | |
|---|---|---|---|
| JP | 04-143266 | | 5/1992 |
| JP | 06-337310 | | 12/1994 |
| JP | 10-280130 | | 10/1998 |
| JP | 2000-252350 | | 9/2000 |
| JP | 2001-107230 | | 4/2001 |
| JP | 2003-183821 | * | 7/2003 |
| JP | 2003-192390 | | 7/2003 |
| JP | 2005-010736 | * | 1/2005 |
| JP | 2005-038914 | | 2/2005 |
| JP | 2005-320568 | | 11/2005 |
| JP | 2007-017750 | * | 1/2007 |
| WO | WO 2005/108638 A1 | | 11/2005 |

OTHER PUBLICATIONS

JP-2007-017750 Patent Abstract of Japan.*
JP-2005-010736 Patent Abstract of Japan.*
JP-02-176601 Patent Abstract of Japan.*
Seal, "Thermal and optical applications of thin film diamond," *Phil. Trans. R. Soc. Lond. A* 342:313-322 (1993).
Office Action for related Japanese Patent Application No. 2007-148760, 4 pages, Jan. 12, 2012.
Office Action for related Japanese Patent Application No. 2007-148760, 3 pages, Sep. 7, 2012 (in Japanese).

* cited by examiner

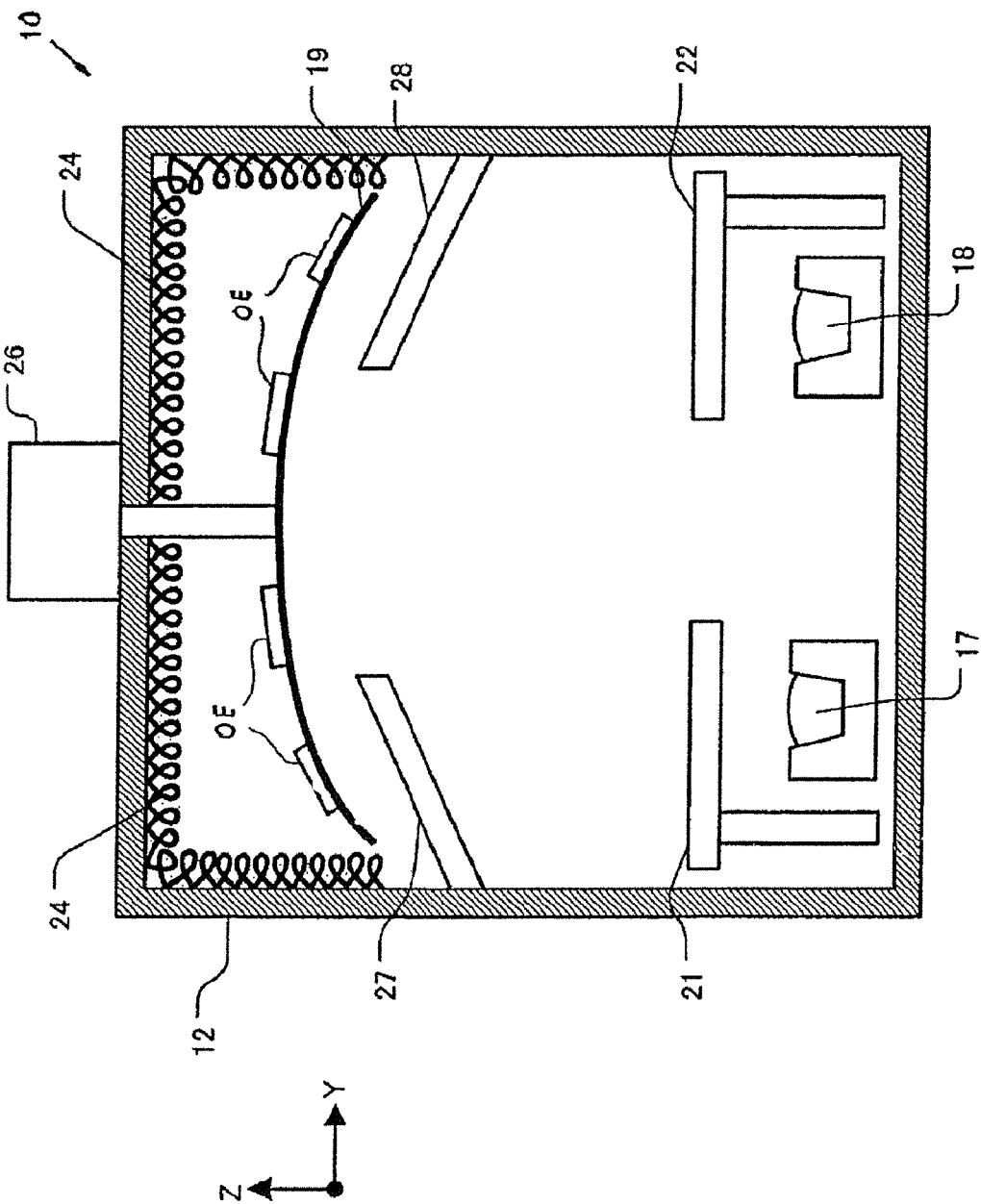

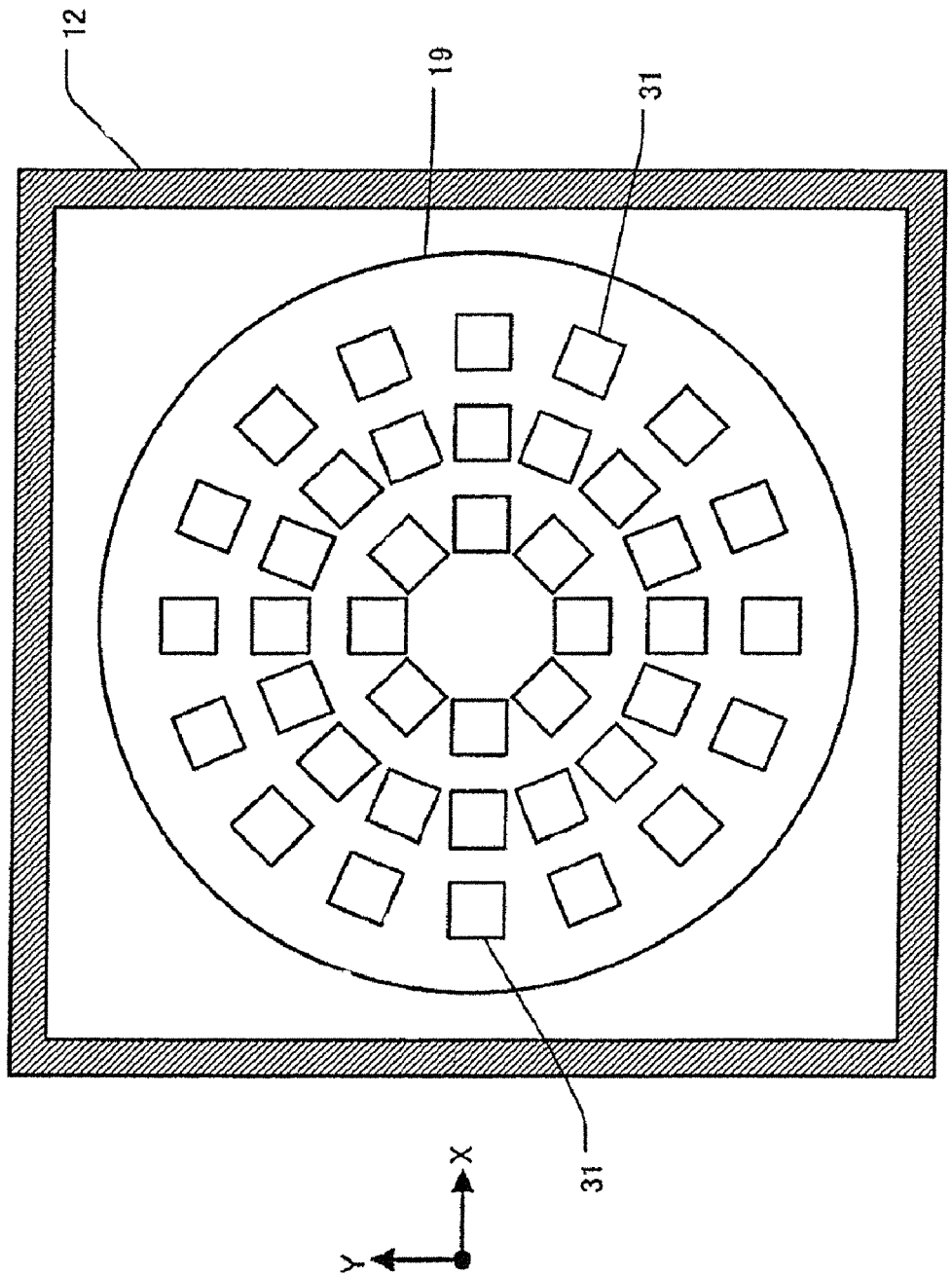

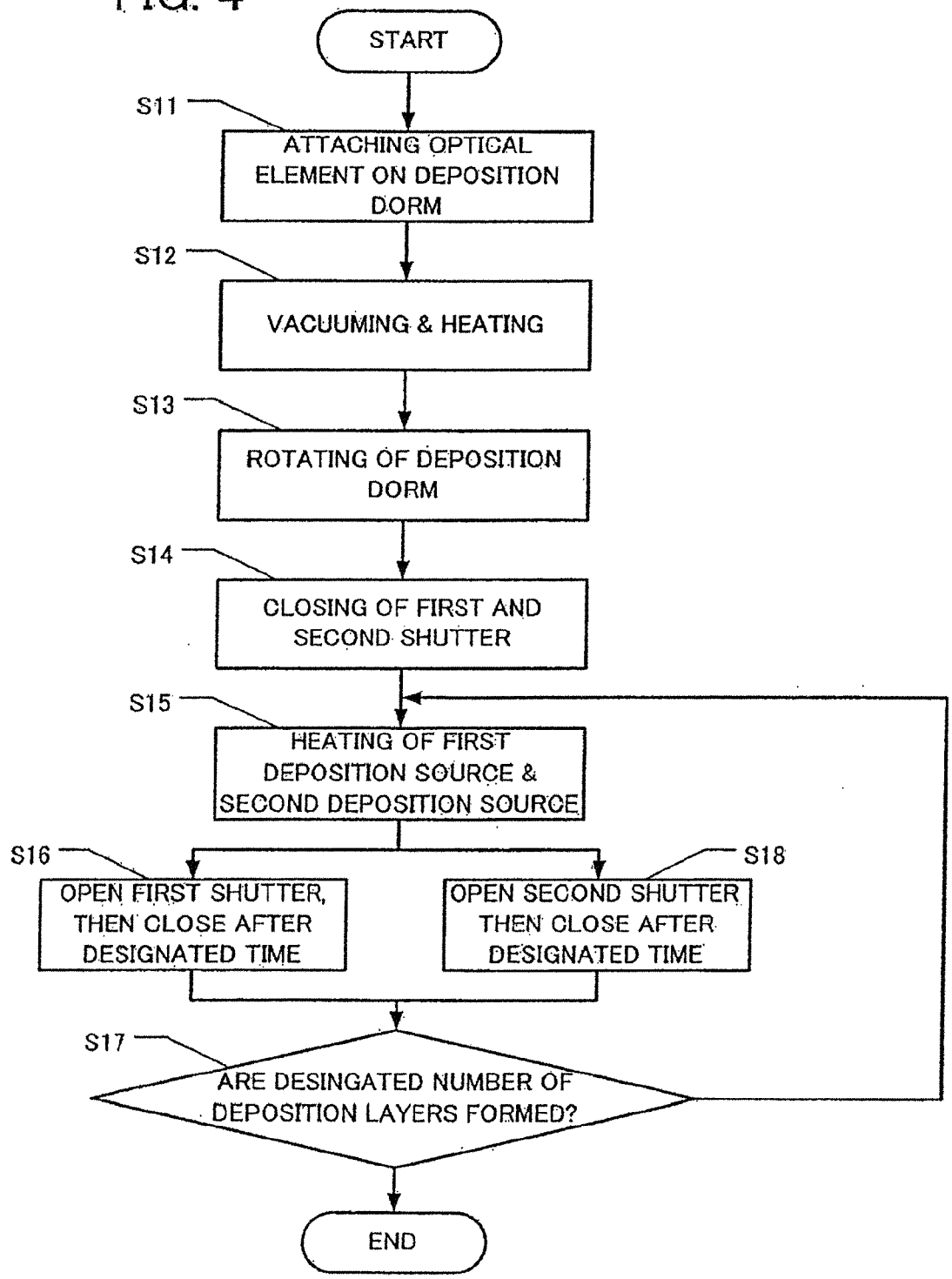

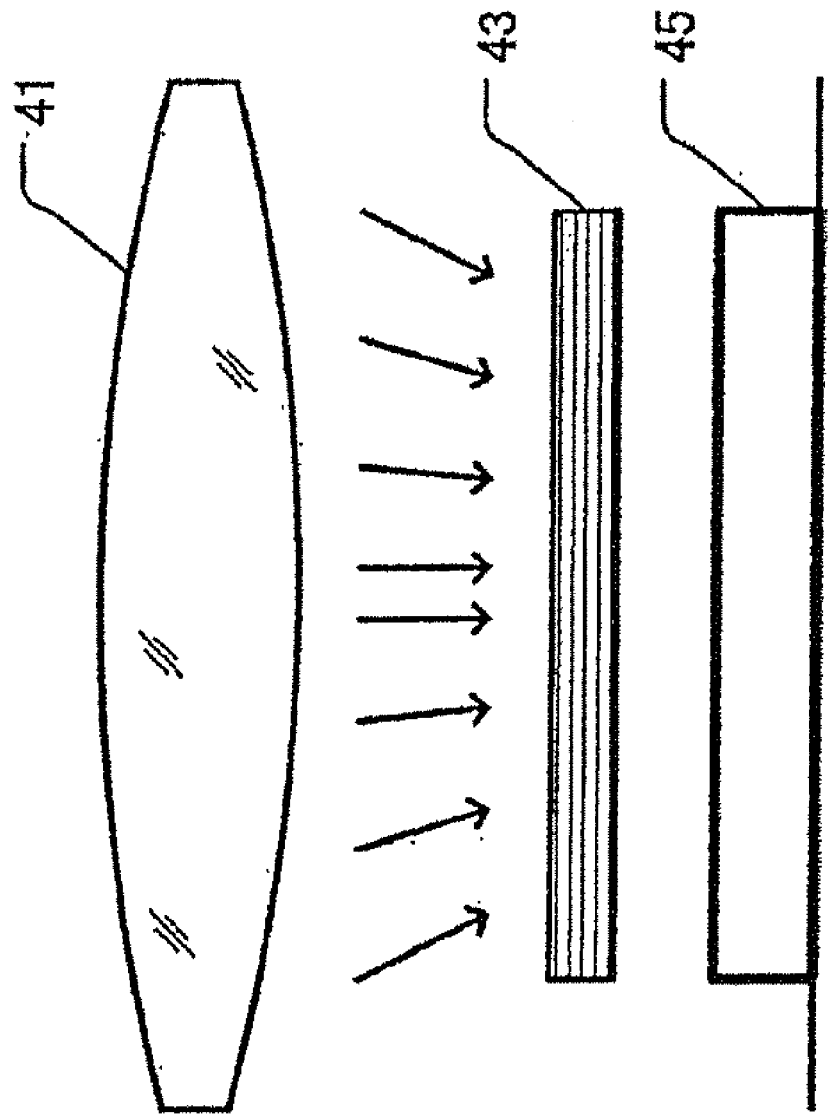

OPTICAL THIN-FILMS AND OPTICAL ELEMENTS COMPRISING SAME

CROSS-REFERENCE TO RELATED APPLICATIONS

This application is a division of U.S. patent application Ser. No. 12/133,287, filed on Jun. 4, 2008 now U.S. Pat. No. 8,075,947, the contents of which are incorporated herein by reference in its entirety. This application also claims priority to and the benefit of Japan Patent Application No. 2007-148760, filed on Jun. 5, 2007, in the Japan Patent Office, which is incorporated herein by reference in its entirety.

FIELD

This disclosure relates to methods for forming optical thin-films and to apparatus for forming one or more optical thin-film layers on an optical element.

DESCRIPTION OF THE RELATED ART

In the manufacture of an optical element such as a lens, optical filter, or prism having a surficial thin film, certain optical thin-film-forming apparatus are conventionally used for forming the film. The conventional optical thin-film-forming apparatus includes a deposition dome having a spherical or planar shape. The dome holds a plurality of optical elements mounted to the surface thereof inside a vacuum chamber. The interior of the vacuum chamber is heated as a layer of film-forming material is deposited on the surfaces of the optical elements. The distance from the source of film-forming material to each optical element on the surface of the deposition dome varies. Hence, the distribution of film-forming material as deposited is not uniform on each optical element. I.e., the physical thickness 'd' of the film-forming material deposited on the optical elements varies depending upon the position of the optical elements on the dome. This variability of the thickness 'd' causes changes the reflectivity or transmissivity of the optical elements.

To reduce the variability of the physical film thickness 'd', Japan Unexamined Patent Application No. 1998-280130 discusses rotating the deposition dome during processing of the optical elements in the apparatus. Whereas rotating the dome reduces the variability of the physical thickness of film material deposited on the optical elements, there is still notable variability of the optical thickness 'nd' of the individual optical elements. The optical thickness 'nd' determines important optical characteristics of each optical element, and is the product of (refractive index 'n')×(physical thickness 'd'). That is, although the optical thin-film-forming apparatus disclosed in Japan Unexamined Patent Application No. 1998-280130 can form a film having uniform physical thickness 'd' on the surface of the optical element, it cannot form a film having uniform refractive index 'n' over the surface; hence, the optical thickness 'nd' of the film is not uniform over the surface.

For example, FIG. 6 is a graph showing the variability of the difference ("gap") of the wavelength half-width ("half-value") from the maximum wavelength value of an optical filter, formed with an optical thin film on a crystal base plate in the conventional manner, as a function of position. In FIG. 6, data for two sizes of crystal base plates (including surficial thin films) are plotted, one having dimensions 58 mm×60 mm size and the other having dimensions 40.5 mm×48 mm. In FIG. 6 the vertical axis is the gap of wavelength half-value from the maximum value (the target half-value of the wavelength is zero, which would yield a zero gap), and the horizontal axis is distance (mm) from a central area of the optical filter to regions of the filter surrounding the central area.

Around the central area of the optical filter, the achieved wavelength half-value is substantially equal to the target wavelength. But, in the surrounding regions, the wavelength half-value is not equal to the target value because the surrounding regions have slightly different properties than the central area. I.e., in the surrounding regions, wavelength is shorter than the designated wavelength. The resulting difference is produced because, even though the physical thickness 'd' is uniform across the base plate, the refractive index in the surrounding regions is lower than in the central area, which reduces the wavelength in the surrounding regions. Although a conventional optical thin-film-forming apparatus can make optical elements having a uniform physical thickness 'd', the apparatus cannot make optical elements having a uniform optical thickness 'nd' over its entire surface. In other words, the conventional optical thin-film-forming apparatus cannot satisfactorily reduce the variability of the refractive index 'n' over the surfaces of the optical elements.

In recent years, improvements in the quality of optical elements including surficial optical thin films are strongly demanded as corresponding improvements are made in the technical sophistication of optical devices. To address this demand, for example, whenever an optical filter having dimensions 40.5 mm×48 mm is required, an optical filter comprising a thin film having uniform physical thickness 'd' on a crystal plate having dimensions 58 mm×60 mm is formed using a conventional optical thin-film-forming apparatus. After forming the filter in the apparatus, peripheral regions of the 58 mm×60 mm plate (having excessively deviant refractive index 'n') are cut away to produce an optical filter having dimensions of 40.4 mm×48 mm and exhibiting reasonably uniform optical thickness 'nd' overall.

In such a manufacturing method, larger optical elements (intended to be peripherally trimmed later) than required are attached to the deposition dome and processed. Thus, the numbers of optical elements that can be attached to the deposition dome are relatively few. Also, having to trim the periphery of the optical elements after forming the thin films wastes the peripheral areas of the optical elements and requires extra work and higher costs.

The instant disclosure provides, inter alia, optical thin-film-forming methods and apparatus for forming optical thin films having uniform optical thickness 'nd' at both the central area and surrounding regions of high-quality optical elements without having to trim peripheral regions of the optical elements.

SUMMARY

An optical thin-film-forming method according to a first aspect forms an optical thin film on an optical base plate while the base plate is situated in a vacuum chamber. The base plate can have any of various configurations not limited to planar and not limited to rectangular or circular. The method comprises mounting the base plates on a plurality of respective retaining frames of a base-plate retainer in a vacuum chamber. The base plates are heated while film-deposition material is emitted from a deposition source in the chamber. The retaining frames are configured to achieve substantially uniform heating of the entire base plates during film-formation processing.

As discussed, conventional methods produce films having uniform physical thickness 'd' but not having uniform optical thickness 'nd'. With methods as disclosed herein, the temperature of the base plates is controlled during processing to produce thin films having substantially uniform refractive index 'n' over the surface of the base plate. Thus, thin-films are produced of which the optical thickness 'nd' is substantially uniform from the central area to the surrounding regions of the optical elements.

According to a second aspect, the retaining step in the method comprises mounting the base plates on retaining frames made of the same material as the base plates. By making the retaining frame of the same material as the base plate, heat in the base plate can be substantially prevented from escaping from the surrounding regions of the optical elements to the retaining frames. This configuration enables the entire base plate to be uniformly heated, which allows formation of thin films of which the optical thickness 'nd' is substantially uniform from the central area to the surrounding regions.

According to a third aspect, the step of retaining the base plates comprises mounting the base plates on retaining frames made of a material having lower thermal conductivity than the base-plate retainers. Thus, the retaining frames are made of a material having relatively low thermal conductivity. It was considered that the heat in surrounding regions of the base plate, and then the refractive index 'n' of the film formed in the surrounding regions, are relatively low because heat escapes from the base plates via the retaining frames to the base-plate retainers. By forming the retaining frames of a material having lower thermal conductivity than the retainers, the entire base plate can be uniformly heated to ensure that the optical thickness 'nd' is uniform from the central area to the surrounding regions.

According to a fourth aspect, the retaining step of the method comprises mounting the base plates on retaining frames that include individual heaters. To such end, the retaining frames are individually heated to provide heat as required to the surrounding regions of the base plates mounted to the retaining frames. Thus, the entire base plate can be heated uniformly, which achieves a substantially uniform optical thickness 'nd' of the film from the central area to the surrounding regions. This aspect also allows manufacture of base plates having elevated refractive index 'n' in the surrounding regions (compared to the central area) by heating the surrounding regions to a temperature higher than the temperature of the central area during processing.

According to a fifth aspect, the retaining step comprises attaching, to the retaining frame holding a base plate, a cover that covers the surrounding region of the base plate. The cover is attached to the retaining frame on the side thereof opposite the side of the deposition source. The cover retains the heat in the surrounding region of the base plate, allowing the entire base plate to be uniformly heated. This aspect also allows manufacture of an optical element having elevated refractive index 'n' in the surrounding regions (compared to central areas) by heating the surrounding regions to a higher temperature than the temperature of the central areas.

The optical element formed by any of the methods summarized above has substantially the same optical thickness 'nd' both at the central area and in surrounding regions. Also possible is the formation, on optical base plates, of optical thin films having higher refractive index in the surrounding regions than in the central area. If the refractive index is higher in the surrounding regions than in the central area, the filter can function at the same wavelength with rays passing through a lens in both dimensions orthogonal to the optical axis.

Therefore, according to the invention, an optical thin film having controlled (e.g., uniform) optical thickness 'nd' can be formed at the center and in surrounding regions of high-quality optical elements.

BRIEF DESCRIPTION OF THE DRAWINGS

FIG. 1 is a schematic elevational section of an optical thin-film-forming apparatus 10.

FIG. 2 is a plan view, from the under-side, of the deposition dome 19 located inside the optical thin-film-forming apparatus 10.

FIG. 4 is a flow chart of an embodiment of a method for making an optical filter.

FIG. 11 is a diagram showing that a beam arrives at a photoelectric converter 45, comprising a CCD or CMOS sensor, from a convex lens via the optical filter 43.

DETAILED DESCRIPTION

Exemplary Configuration of Optical Thin-Film-Forming Apparatus

Figure 3A:
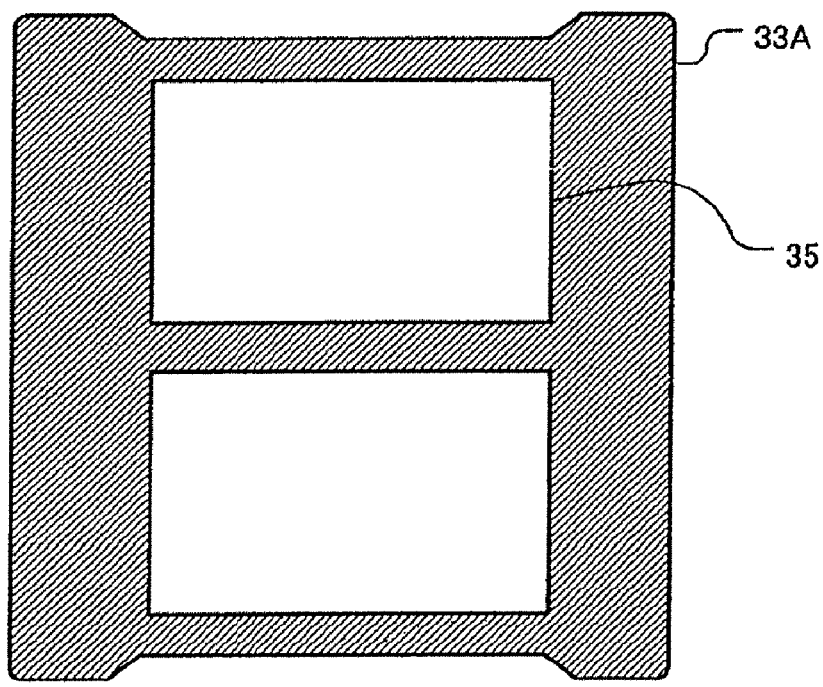
FIG. 3A is a plan view of a first embodiment of a retaining frame 33A for attaching two optical elements OE on one retaining frame.

FIG. 1 is an elevational section of an embodiment of an optical thin-film-forming apparatus 10. The optical thin-film-forming apparatus 10 of this embodiment comprises a first deposition source 17 and a second deposition source 18 arranged off-center in the lower portion of a deposition (vacuum) chamber 12. The chamber 12 also contains a deposition dome 19 that includes base-plate-retaining portions that hold optical elements OE made of glass or crystal, for example. The deposition chamber 12 is evacuated to a suitable vacuum level, such as approximately $10^{-4}$ Pa. The first deposition source 17 contains a film-forming material such as $TiO_2$, which evaporates when it is irradiated by an energeticion beam. The second deposition source 18 contains a material such as $SiO_2$, which evaporates when it is irradiated by an electron beam.

Also located inside the chamber 12 are a first shutter 21, movable from an open position to a shielding position between the first deposition source 17 and the deposition dome 19, and a second shutter 22, movable from an open position to a shielding position between the second deposition source 18 and the deposition dome 19. The apparatus 10 also includes a control system (not shown) configured to actuate, in an alternating manner, the first shutter 21 and the second shutter 22, depending upon the desired thickness and composition of the optical thin film to be formed on the optical elements OE. More specifically, the control system opens and closes, in an alternating manner, the first shutter 21 and the second shutter 22 as required to expose the sources 17, 18 selectively to the energetic ion beams to form the films. The movements of the first shutter 21 and of the second shutter 22 control the beginning and end of formation of each thin-film layer. The physical film thickness 'd' is controlled with rotation locomotion of the deposition dome 19 relative to the first deposition source 17 and the second deposition source 18.

A first diffusion panel 27 and a second diffusion panel 28 are arranged above the first shutter 21 and the second shutter 22, respectively, at positions adjacent the surrounding area of the deposition dome 19 so as to form the physical film thickness 'd' on the optical elements OE in a uniform manner.

The deposition dome 19 is supported and rotatable at about the center line of the deposition chamber 12 via a driving motor 26 situated above the chamber 12. Also, a heater 24 is provided above the deposition dome 19 inside the chamber 12. Radiant heat produced by the heater 24 heats the deposition dome 19 and the optical elements OE to a designated temperature, for example from 200° C. to 270° C. Whenever the energetic ion beam is irradiated on the first deposition source 17 and/or the second deposition source 18, the temperature inside the deposition chamber 12 can be more than 280° C. Note that the deposition dome 19 may be not only spherical in shape, but also planar or a stepped-dome configuration.

FIG. 2 is a plan view, upward from the under-side of the deposition dome 19 inside the optical thin-film-forming apparatus 10. The deposition dome 19, as shown in FIG. 2, includes a plurality of rectangular openings or voids 31 arranged in a concentric fashion. Each rectangular opening 31 has dimensions of, for example, 100 mm on a side. A retaining frame 33, configured to retain a respective optical elements OE, is attached to each rectangular opening 31. The deposition dome 19 is made of a suitable metal such as stainless steel or steel.

Figure 3B:
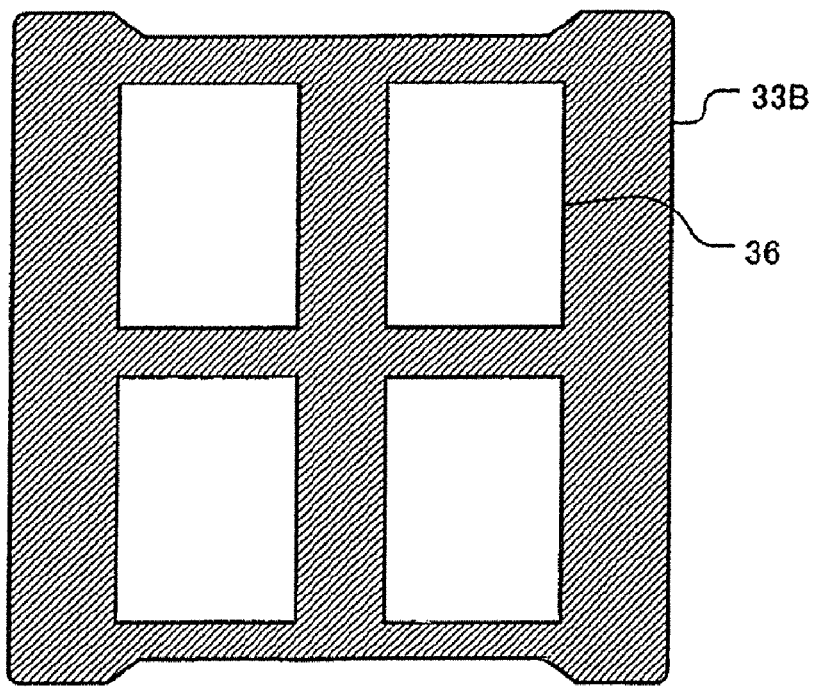
FIG. 3B is a plan view of a second embodiment of a retaining frame 33B for attaching four optical elements OE on one retaining frame.

FIG. 3 provides plan views of exemplary retaining frames 33. FIG. 3A shows a first embodiment of a retaining frame 33A configured to hold two optical elements OE. The retaining frame 33A defines a pair of first voids 35 through which evaporated material from the first deposition source 17 or from the second deposition source 18 passes to the optical elements OE being held by the retaining frame 33A. The optical elements OE are made of, for example, glass or crystal. FIG. 3B shows a second embodiment of a retaining frame 33B to which four optical elements OE can be attached. The retaining frame 33B defines four voids 36 through which evaporated material from the first deposition source 17 or from the second deposition source 18 passes to the optical elements OE being held by the retaining frame 33B. Although not shown, a retaining frame 33 can be configured to hold only one optical element OE per retaining frame.

The retaining frames 33 can be configured to hold not only rectangular-shaped optical elements OE, but also round-shaped or other-shaped optical elements. In the depicted embodiment, the deposition dome 19 and the retaining frames 33 are separate entities; in an alternative configuration, the deposition dome 19 itself is configured with rectangular voids 31 each with its own retaining frame to retain the optical elements OE.

Movements of the Optical Thin-Film-Forming Apparatus

Next, a method for making an optical filter comprising an optical thin film having forty layers is described with reference to FIG. 4. The method utilizes the optical thin-film-forming apparatus 10 described above. FIG. 4 is a flow-chart of the method, as applied to making an optical filter. In step S11 the optical elements OE are attached to respective retaining frames 33, and the retaining frames 33 (with attached optical elements) are mounted to the deposition dome 19. In step S12 regions inside the deposition chamber 12, especially the deposition dome 19 and the optical elements OE, are heated to a designated temperature by the heater 24 as the deposition chamber 12 is being evacuated to a desired vacuum level. In step S13 the deposition dome 19 is rotated at a desired angular velocity by the driving motor 26. In step S14 the first shutter 21 and the second shutter 22 are in their closed positions. In step S15 the first deposition source 17 and the second deposition source 18 are heated by an energetic ion beam. In step S16 the first shutter 21 is opened for a predetermined length of time to deposit material from the first deposition source 17 as a first thin-film layer on the optical elements OE. After the designated time, the first shutter 21 is returned to the closed position. Thus, the first layer of the film is formed, and the method progresses to the next step S17. In step S17 a determination is made of whether the designated number of layers has been deposited on the optical elements. If only the first layer has been formed, the process advances to step S18 via step S15. In step S18, material from the second deposition source 18 is deposited as a second thin-film layer on the optical elements OE. To such end the second shutter 22 is opened and left opened for a predetermined length of time, then closed. Thus, the second layer of the film is deposited. Then, the method advances to the step S17. By repeating steps S16 and S18 as required, the desired thing-film-coated optical elements are produced, such as optical filters on which the thin films comprise forty layers.

Uniformizing 'nd' Across the Optical Thin Film

The optical thin films provide the optical elements OE with a characteristic denoted 'nd', or "optical thickness," which is a product of (refractive index 'n')×(physical film thickness 'd'). If the physical film thickness 'd' is uniform across the optical element, if the refractive index 'n' decreases across the optical element, then the optical-film thickness 'nd' correspondingly decreases across the optical element. For example, if the optical-film thickness 'nd' of an infrared cut-off filter is decreased in a particular region of the filter, then the wavelength range of IR radiation passed by the filter is also decreased.

Figure 5:
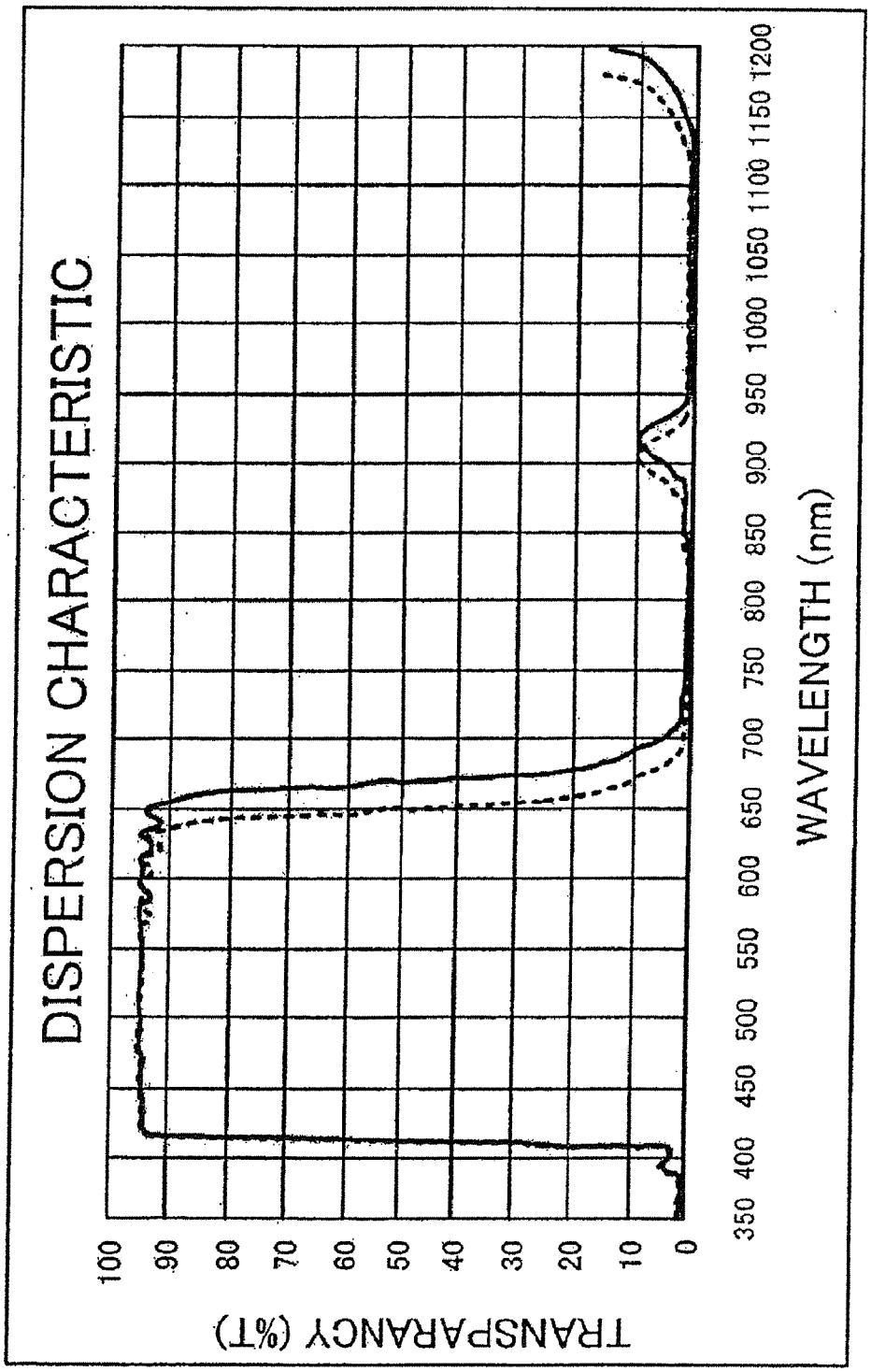
FIG. 5 is a graph of the spectral transmission of an infrared cut-off filter configured as 1 mm of tested crystal plate having forty layers of an optical thin film.

FIG. 5 is a graph of the spectral transparency of an exemplary infrared cut-off filter, of which 1 mm of the crystal plate having forty layers of an optical thin film was tested. The vertical axis is transparency and the horizontal axis is wavelength (350 nm to 1200 nm). The solid-line plot is of transparency of the central area of the infrared cut-off filter, and the dashed-line plot is of transparency of peripheral regions of the infrared cut-off filter (surrounding the central area of the filter). As can be seen, the transparency of the peripheral regions is shifted to shorter wavelengths, compared to the central area.

Figure 6:
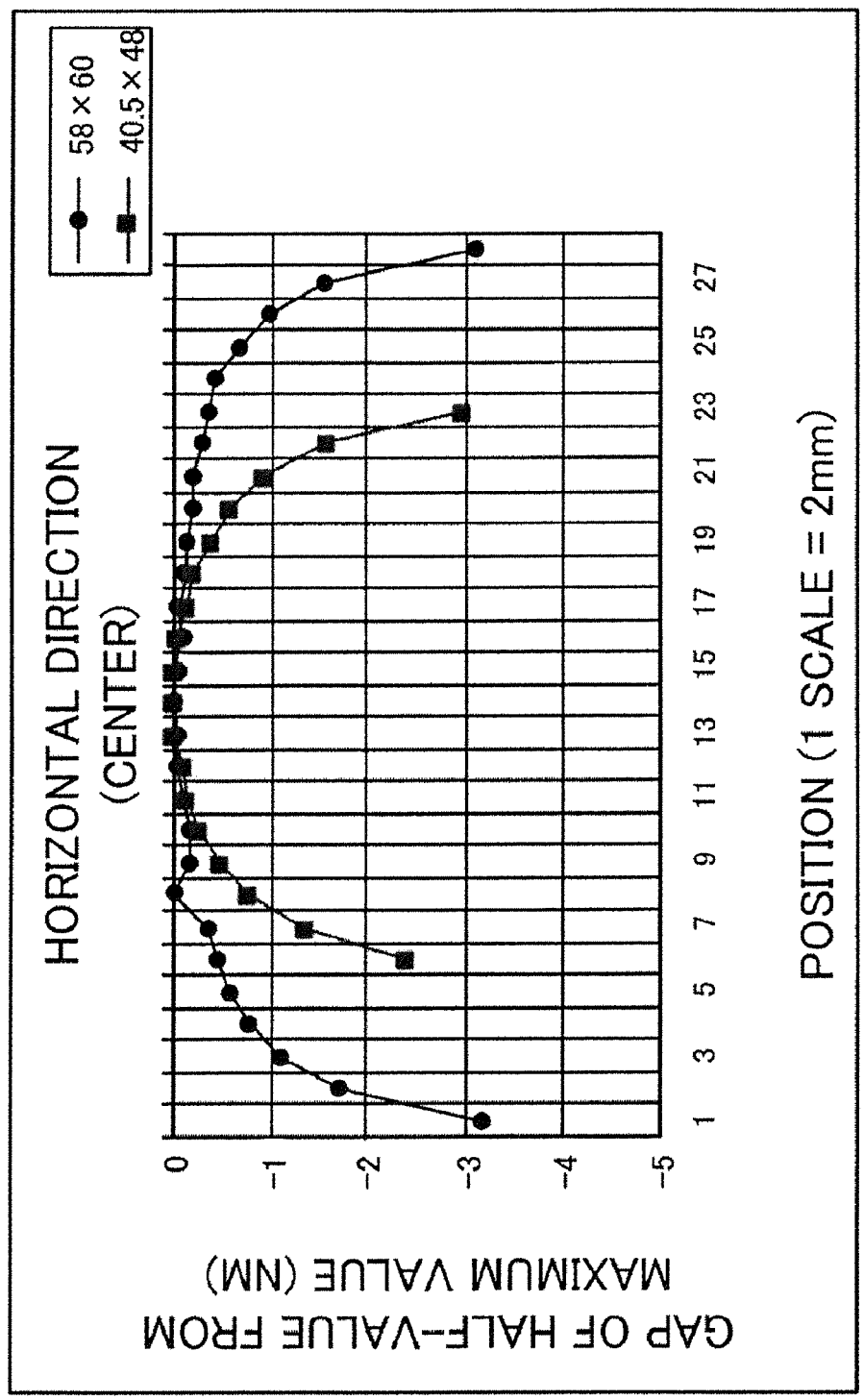
FIG. 6 is a graph which shows the difference ("gap") in wavelength half-value minus maximum wavelength passed by an optical filter, compared to a target value.

FIG. 6 is a graph showing of the difference ("gap") of wavelength half-values from maximum wavelength exhibited by two different sizes of optical filters, relative to respective target values. The filters each comprise a thin film on a crystal plate. In FIG. 6 the vertical axis is the difference ("gap") of wavelength half-value (target half-value is zero), for wavelengths providing 50% transparency in FIG. 5. The horizontal axis is position (mm) from the central area to the regions of the optical filter surrounding the central area. With both crystal base plates having dimensions of 58 mm×60 mm and 40.5 mm×48 mm, respectively, the wavelength half-values exhibited at the surrounding regions progressively decrease and are lower than the line of −2 nm in the far-surrounding regions.

Figure 7:
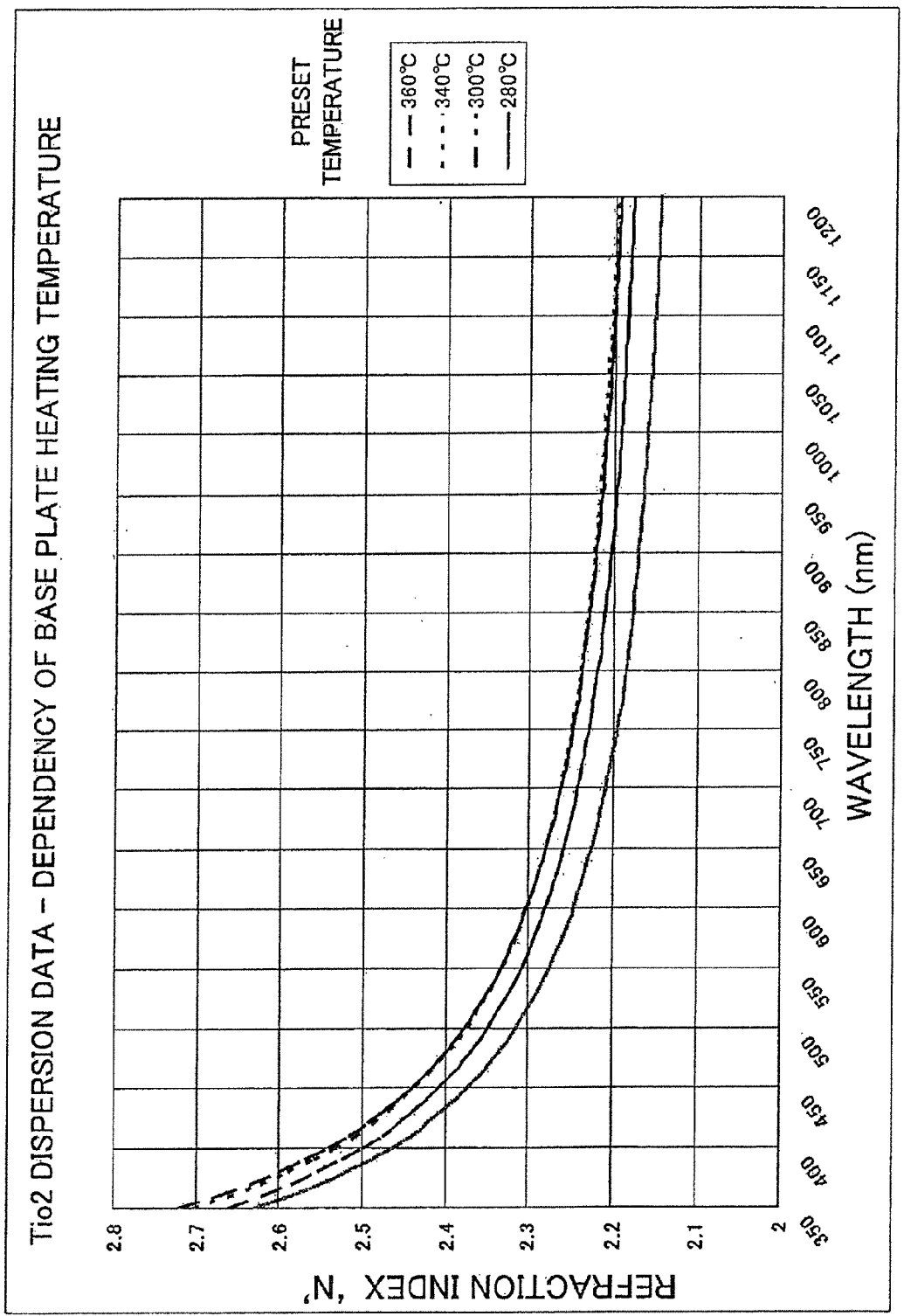
FIG. 7 is a graph showing the effect of heating temperature of a crystal base plate on refractive index of an area including a $TiO_2$ film.

FIG. 7 is a graph showing the effect on dispersion by a $TiO_2$ layer on a crystal base plate to various wavelengths at different temperatures. Index of refraction ('n') is the vertical axis and wavelength is the horizontal axis. This graph shows that the refractive index of $TiO_2$ increases with increases in process temperature. More specifically, at any specific wavelength, increasing the process temperature produces a corresponding increase in refractive index 'n' of $TiO_2$. From this data the inventor discovered that the optical thickness 'nd' can be made substantially uniform by appropriate control of process temperature in the surrounding regions versus central area, e.g., by maintaining the temperature of the surrounding regions of the optical element OE the same as the temperature of the central area of the optical element during thin-film formation. If the temperature of the heater 24 is simply raised in the conventional optical thin-film-forming apparatus 10, the temperature of the central area of the optical element OE is correspondingly increased, but the temperature remains non-uniform across the optical element. Therefore, the following embodiment achieves uniformity of the temperature of the surrounding regions and central area of the optical element OE (or even achieves slightly higher temperature of the surrounding regions compared to the central area, if desired).

In the first embodiment, the retaining frame 33 shown in FIG. 3 is made of the same material as the optical element OE. Conventionally, the retaining frame 33 is made of the metal used to form the deposition dome 19, such as stainless steel or steel. However, in this embodiment, the retaining frame is made of the same material as the optical elements OE so as to have the same thermal conductivity as the optical elements. More generally, the retaining frame can be made of a material having lower thermal conductivity than stainless steel or steel to ensure that some heat in the surrounding regions of the optical element OE escapes through the retaining frame 33 to the deposition dome 19. For example, the thermal conductivity of stainless steel having low thermal conductivity is 15 W/mK whereas the thermal conductivity of glass is 1 W/mK and of crystal is 8 W/mK.

Figure 10A:
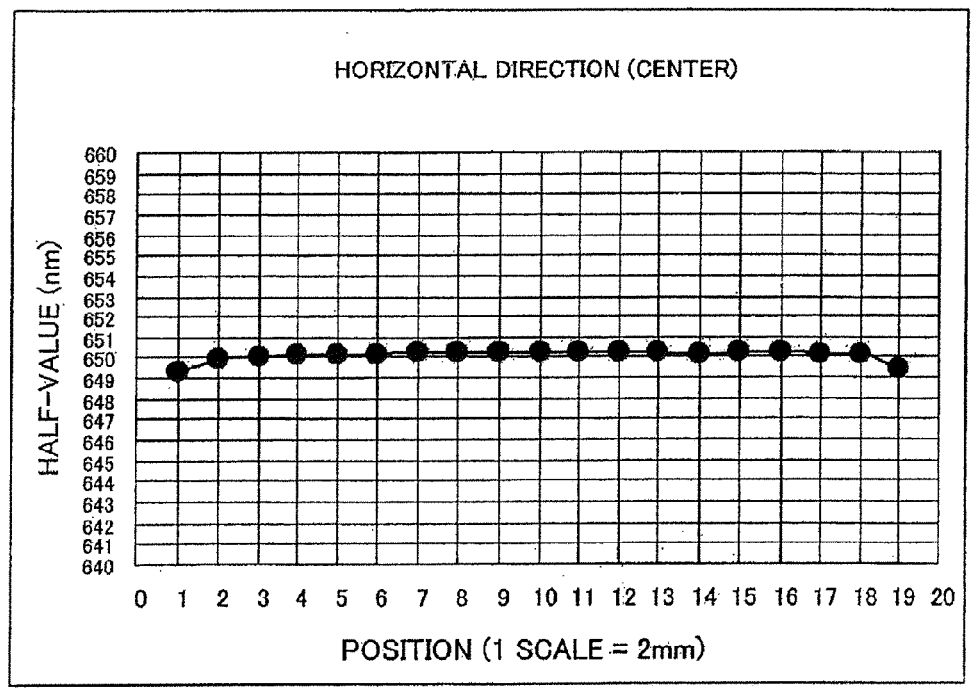
FIG. 10A is a graph showing the wavelength half-value (as a function of position) of a crystal base plate having size of 40.5 mm×48 mm, processed by an apparatus comprising individual heaters for the retaining frames.

Using a retaining frame 33 made of the same material as the optical element OE, an infrared cut-off filter was made according to the method diagrammed in FIG. 4. FIG. 10A is a graph of the wavelength half-value exhibited by a crystal base plate having dimensions of 40.5 mm×48 mm formed in this manner. Note that the curve in FIG. 10A differs significantly from the curve shown in FIG. 6 produced by a conventionally formed crystal base plate of the same size (40.5 mm×48 mm). In FIG. 10A the wavelength half-value is substantially constant both at the central area and at the surrounding regions, the half-value being only about 1 nm lower at the outer edges of the surrounding regions.

In a second embodiment, a retaining frame 33 as shown in FIG. 3 is made of zirconia ceramic material. This embodiment of a retaining frame 33 has a microporous structure and exhibits heat resistance. Thus, very little heat in the surrounding regions escapes to the deposition dome 19 via the retaining frame 33. The thermal conductivity of zirconia ceramic material having microporous structure is 0.2 W/mK. Thus, a retaining frame 33 formed of this material has lower thermal conductivity than the deposition dome 19 made of a metal such as stainless steel. The thermal conductivity is preferably less than 1.0 W/mK.

Using a retaining frame 33 made of zirconia ceramic material, an infrared cut-off filter was made using the method diagrammed in FIG. 4. This infrared cut-off filter exhibited the nearly flat curve of wavelength half-values as shown in FIG. 10A. That is, the wavelength of the infrared cut-off filter does not significantly decrease even at the surrounding regions.

In alternative embodiments, the retaining frame 33 is made of soda glass or crown glass instead of the zirconia ceramic material.

Figure 8A:
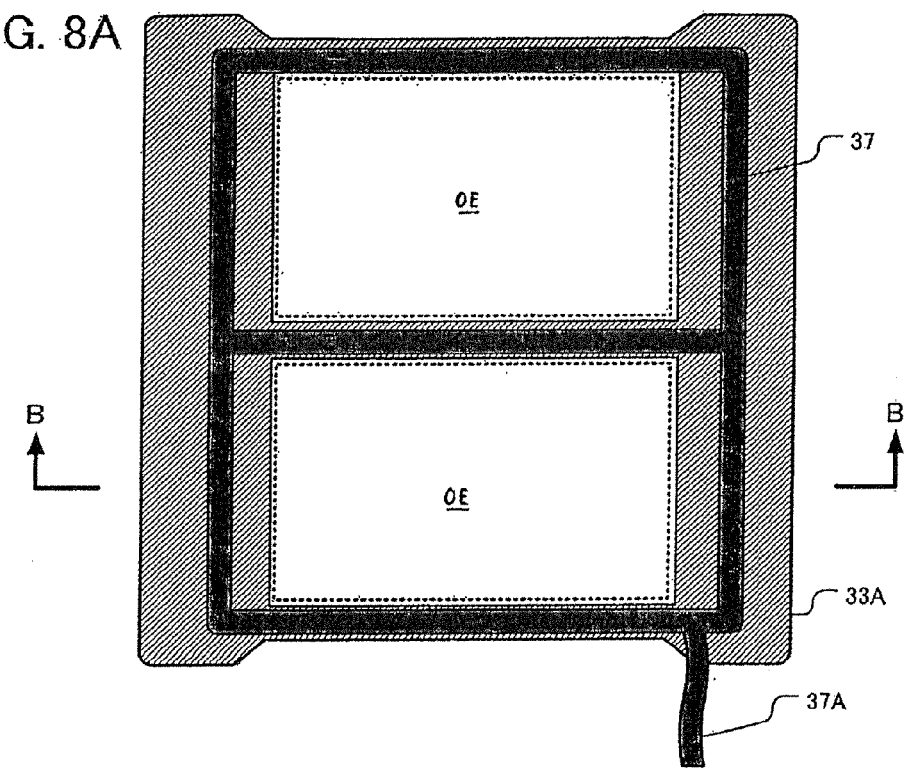
FIG. 8A is a plan view of an embodiment of the retaining frame 33A comprising an electric heater 37.
Figure 8B:
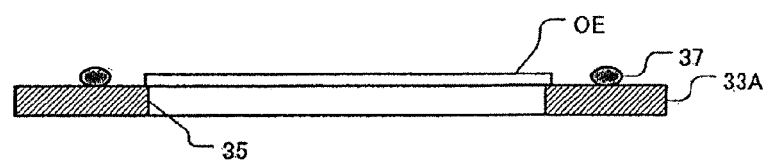
FIG. 8B is an elevational section along the line B-B of FIG. 8A.

In a third embodiment, as shown in FIG. 8, an electric heater 37 is arranged around voids 35 in the retaining frame 33A. FIG. 8A is a plan view of the retaining frame 33A including the electric heater 37, and FIG. 8B is an elevational section taken along the line B-B of FIG. 8A. The retaining frame 33 of this embodiment can be made of a metal such as stainless steel or steel since the electric heater 37 heats the retaining frame 33 as desired. Meanwhile, the deposition dome 19 is heated by the heater 24 to a temperature of 200 to 270° C. As a result, the inner temperature of the deposition chamber 12 may be higher than a preset temperature as the beam of energetic ions heats the first deposition source 17 and the second deposition source 18. The electric heater 37 heats the retaining frame 33 to a temperature of 270 to 310° C. The heater 37 includes a power cord 37A that can be connected to an adjacent heater (e.g., in an adjacent retaining frame) and finally connected to a power source.

An infrared cut-off filter was made by a method according to the flow-chart shown in FIG. 4, using the retaining frame 33A with the electric heater 37 to adjust the temperature of the optical element. Examples of this infrared cut-off filter exhibited substantially the same distribution of wavelength half-value as shown in FIG. 10A.

Figure 10B:
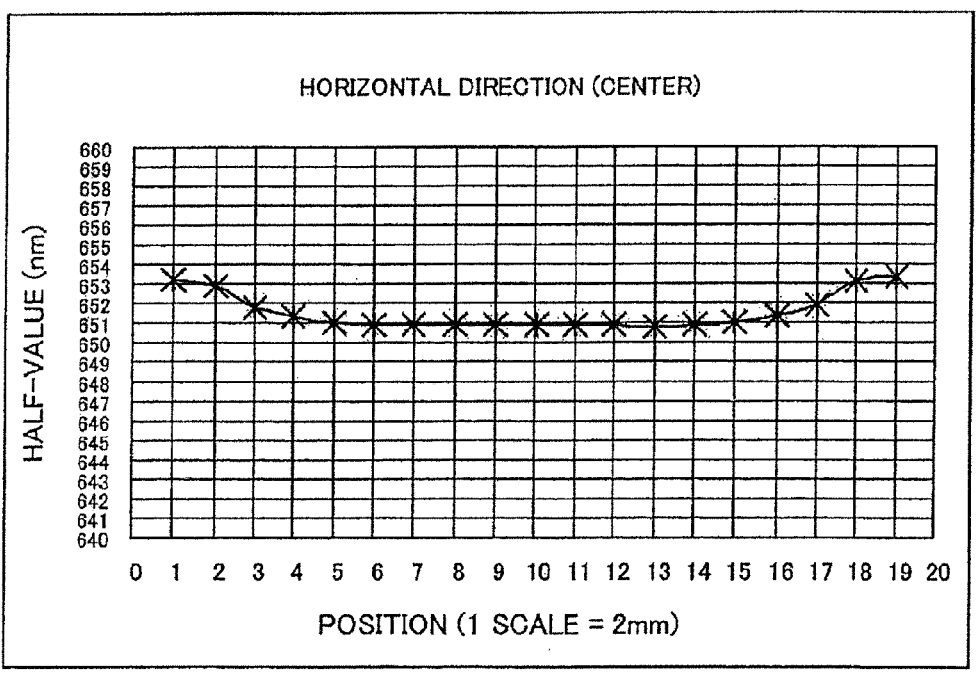
FIG. 10B is a graph showing the wavelength half-value (as a function of position) of a crystal base plate processed by an apparatus comprising individual covers for the retaining frames.

If the infrared cut-off filter is formed by adjusting the temperature of the electric heater 37 so that the temperature of the surrounding regions of the optical element OE is higher than the temperature of the central area, a wavelength half-value distribution as shown in FIG. 10B is produced. That is, the filter producing the data shown in FIG. 10B has a slightly higher wavelength half-value in the surrounding regions than in the central area. Since the physical film thickness 'd' is substantially uniform across the optical element, the refractive index 'n' of the deposited film material progressively increases from the central area to the surrounding regions.

Figure 9A:
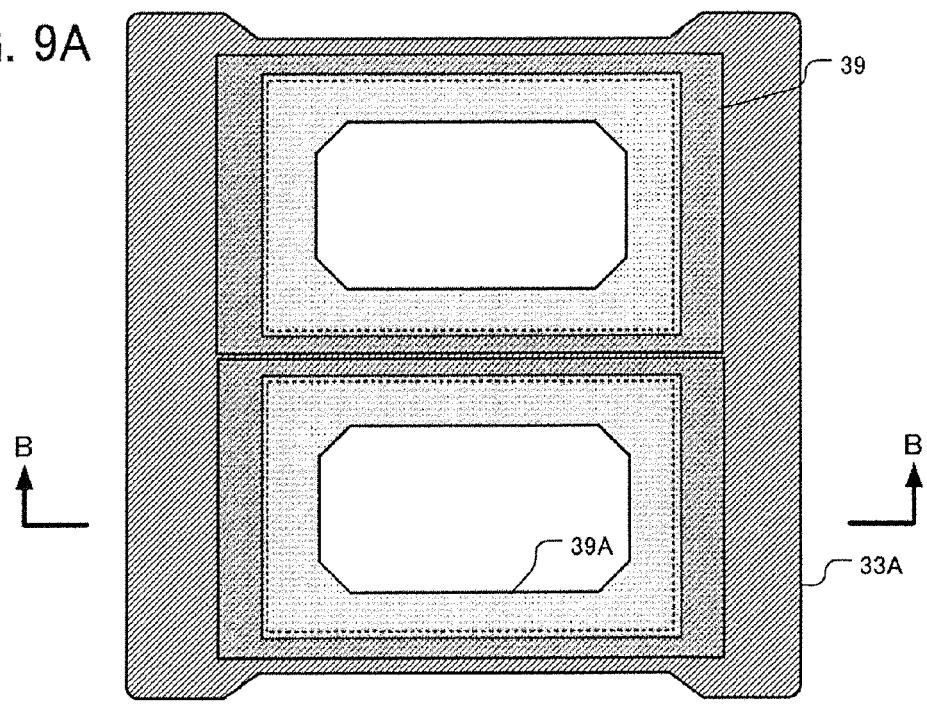
FIG. 9A is a plan view of an embodiment of the retaining frame 33 including a heat-retaining cover 39.
Figure 9B:
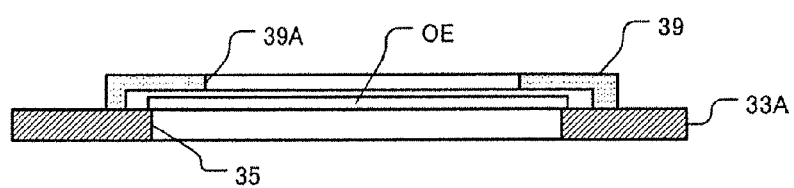
FIG. 9B is an elevational section along the line B-B of FIG. 9A.

In a fourth embodiment, as shown in FIG. 9, a heat-retaining cover 39 is situated around the first void 35 of the retaining frame 33A. FIG. 9A is a plan view of the retaining frame 33 including the heat-retaining cover 39, and FIG. 9B is an elevational section along the line B-B of FIG. 9A. The retaining frame 33A of this embodiment is made of a metal such as stainless steel or steel. The heat-retaining cover 39 is made of the same material. The heat-retaining cover 39 is situated on the opposite side from the first deposition source 17 or the second deposition source 18, i.e., on the side of the heater 24. Each heat-retaining cover 39 defines a void 39A; the heat of the optical element OE in the area of the void 39A is not retained. That is, heat in the central area of the optical element OE is not retained by the cover. It is difficult to dispose of the heat of the optical element OE adjacent the heat-retaining cover 39, which allows the temperature around the surrounding region of the optical element to become at least equal to the temperature in the central area.

Using a retaining frame 33A with the heat-retaining cover 39, an infrared cut-off filter was made based by a method as diagrammed in FIG. 4. This infrared cut-off filter exhibited almost the same profile of wavelength half-value shown in FIG. 10 by controlling the size of the void 39A and the thickness of the heat-retaining cover 39. If the infrared cut-off filter is formed using a heat-retaining cover 39 having small voids 39A, as shown in FIG. 10B, the infrared cut-off filter exhibits higher wavelength half-value at the surrounding regions than at the central area of the filter.

Optical Filter Having Thick Optical Film Thickness 'nd' in Surrounding Region

The third and fourth embodiments allow infrared cut-off filters having higher wavelength half-values at the surrounding regions than at the central areas to be manufactured. When such an infrared cut-off filter receives a beam irradiated via a lens, it can be used as an effective infrared cut-off filter.

FIG. 11 is a conceptual figure showing that a beam arrives at a photoelectric converter 45 (CCD or CMOS) from a convex lens via an optical filter 43. The rays passing through the convex lens 41 are refracted relatively more in the surrounding regions and relatively less in the central area. Whenever the incoming beam is not vertically incident, it is shifted to a short-wavelength side in proportion to the incidence angle. Consequently, if the optical filter 43 has a larger wavelength half-value in the surrounding regions than in the central area, as shown in FIG. 11, then the beam propagating to the photoelectric converter 45 can enter the photoelectric converter with the same wavelength both at the surrounding regions and the central area. This allows the photoelectric converter 45 to achieve the same color sensing in both surrounding and central areas.

Note that the technical scope of present invention is not limited to the foregoing embodiments, and various changes may be made to the embodiments without departing from the scope of the invention. For example, in the described embodiments, film-forming is performed by vacuum-deposition. But this is not intended to be limiting. For example, film-forming can be performed to produce a combination of layers of organic material and inorganic material by the RF ion-plating method. In RF ion-plating, an inorganic material is evaporated by vacuum heating to generate scientifically active ions or particles of an organic and inorganic material by plasma discharge. Both materials can be combined. An organic material is introduced in a carrier gas such as an inert gas (e.g., argon or helium) and an inorganic/organic combined film is created by the energy of the plasma.

Also, the disclosed embodiments were described in the context of an infrared cut-off filter. This is not intended to be limiting. The filter can be another type of optical filter. The present invention also can be applied to a lens or prism having a glass or crystal base plate comprising an optical thin film.

What is claimed is:

1. An optical element, comprising:
a base plate having a surface including a central area and a surrounding region; and
an optical thin film on the surface, the optical thin film in the surrounding region having a refractive index (n) that is greater than the refractive index of the optical thin film in the central area.

2. An optical element, comprising:
a base plate having a surface including a central area and a surrounding region; and
an optical thin film, having refractive index (n) and physical film thickness (d), formed on the central area and surrounding region of the surface of the base plate, wherein an optical thickness (nd) of the thin film in the surrounding region is greater than the optical thickness of the thin film in the central area, wherein nd=(n×d).

3. The optical element of claim 2, wherein:
the physical film thickness (d) of the optical thin film is substantially uniform over the central area and surrounding region, and
the refractive index (n) of the optical thin film in the surrounding region is greater than the refractive index in the central area.

4. An optical element, comprising:
a base plate having a surface including a central area and a surrounding region; and
an optical thin film, having a refractive index (n) and a physical film thickness (d), formed on the surface of the base plate including the central area and surrounding region, the optical thin film having an optical thickness (nd) that progressively increases from the central area to the surrounding region, and nd=(n×d).

5. The optical element of claim 4, wherein:
the physical film thickness (d) of the optical thin film is substantially uniform over the central area and surrounding region, and
the refractive index (n) of the optical thin film progressively increases from the central area to the surrounding region.

* * * * *